United States Patent
Chiu et al.

(10) Patent No.: US 8,304,980 B2
(45) Date of Patent: Nov. 6, 2012

(54) FLOURESCENCE MATERIAL AND WHITE LIGHT ILLUMINATION ELEMENT

(75) Inventors: Chuang-Hung Chiu, Hsinchu County (TW); Huai-An Li, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 4 days.

(21) Appl. No.: 13/008,909

(22) Filed: Jan. 19, 2011

(65) Prior Publication Data

US 2012/0126686 A1    May 24, 2012

(30) Foreign Application Priority Data

Nov. 19, 2010  (TW) .............................. 99140032 A

(51) Int. Cl.
*H01L 33/00* (2010.01)
*H01J 1/62* (2006.01)
*C09K 11/80* (2006.01)

(52) U.S. Cl. ........ 313/503; 313/501; 313/498; 313/486; 252/301.4 R; 252/301.4 F

(58) Field of Classification Search .................. 313/498, 313/501, 503
See application file for complete search history.

(56) References Cited

U.S. PATENT DOCUMENTS

| 5,777,350 A * | 7/1998 | Nakamura et al. ............... 257/96 |
| 2001/0010449 A1* | 8/2001 | Chiu et al. ..................... 313/501 |
| 2002/0032118 A1* | 3/2002 | Oshio ............................ 501/120 |
| 2004/0130256 A1* | 7/2004 | Juestel et al. .................. 313/487 |
| 2005/0253114 A1* | 11/2005 | Setlur et al. ............ 252/301.4 R |
| 2007/0164308 A1* | 7/2007 | Yoshimura et al. ........... 257/103 |
| 2008/0160343 A1* | 7/2008 | Nazarov et al. ............... 428/690 |

FOREIGN PATENT DOCUMENTS

TW    200825154    6/2008

OTHER PUBLICATIONS

S.R. Jansen et al., "Eu-Doped Barium Aluminum Oxynitride with the B-Alumina-Type Structure as New Blue-Emitting Phosphor" Journal of the Electrochemical Society, 146(2)pp. 800-806, 1999.*

* cited by examiner

*Primary Examiner* — Sikha Roy
(74) *Attorney, Agent, or Firm* — Jianq Chyun IP Office

(57) ABSTRACT

A fluorescence material and a white light illumination element are provided. The white light illumination element includes a light emitting diode (LED) chip, a first fluorescence material, and a second fluorescence material. The LED chip is configured on a substrate and emits an exciting light. The first fluorescence material and the second fluorescence material are configured on the LED chip. A composition of the first fluorescence material includes an aluminum nitride oxide doped with at least one of europium (Eu) and manganese (Mn). A first emitted light emitted by the first fluorescence material after the first fluorescence material absorbs the exciting light emitted from the LED chip and a second emitted light emitted by the second fluorescence material after the second fluorescence material absorbs the exciting light emitted from the LED chip are mixed to generate a white light.

10 Claims, 4 Drawing Sheets

FLOURESCENCE MATERIAL AND WHITE LIGHT ILLUMINATION ELEMENT

CROSS-REFERENCE TO RELATED APPLICATION

This application claims the priority benefit of Taiwan application serial no. 99140032, filed on Nov. 19, 2010. The entirety of the above-mentioned patent application is hereby incorporated by reference herein and made a part of this specification.

BACKGROUND OF THE INVENTION

1. Field of the Invention

The invention relates to a fluorescence material and an illumination element. More particularly, the invention relates to a fluorescence material and a white light illumination element in which the fluorescence material is applied.

2. Description of Related Art

A light emitting diode (LEDs) has various advantages, such as long service life, small volume, high shock resistance, low heat output, and low power consumption, and therefore the LED has been widely applied in indicators or light sources for household appliances and various equipment. In recent years, the LED has been developed toward multicolor and high luminance, and thus the application scope of the LED has been expanded to large outdoor billboards, traffic signal lights, and the like. Recently, light output efficiency of the LED is continuously increasing, such that conventional fluorescent lamps and incandescent bulbs tend to be gradually replaced by a white LED device when the white LED device serves as a light source of a scanner, a backlight source of a liquid crystal display screen, an illuminator, and so forth.

The conventional white LED device can be mainly divided into the following categories:

1. The white light is generated by a red LED chip, a blue LED chip, and a green LED chip. Since a plurality of single-colored LED chips are required in this type of white LED device, the production costs are rather high, and the design of the driving circuit is relatively complicated.

2. The white light is generated by a blue LED chip together with yellow fluorescence powder. The production costs of said white LED device are relatively low. However, the common yellow fluorescence powder includes the yttrium aluminum garnet (YAG) fluorescence powder, and the YAG fluorescence powder applied to the white LED device often has unfavorable color rendering property.

3. The white light is generated by an LED chip together with red fluorescence powder and yellow-green fluorescence powder. In the patent publication no. W002/11173 to ORSAM, the yellow-green fluorescence powder refers to the sulfide-containing fluorescence powder. In this case, the white LED device can have favorable color rendering property. Nonetheless, the sulfide-containing fluorescence powder is very much likely to react with moisture in the air, thus resulting in poor stability and deterioration of the quality of the white LED device.

SUMMARY OF THE INVENTION

The invention is directed to fluorescence powder. By applying the invention, the wavelength of an emitted light emitted by the fluorescence powder can be adjusted based on different demands.

The invention is further directed to a white light illumination element that has favorable color rendering property and favorable quality.

The invention provides a fluorescence material that has a composition. The composition includes an aluminum nitride oxide doped with at least one of europium (Eu) and manganese (Mn).

According to an embodiment of the invention, the aluminum nitride oxide includes $(M_{l-m-n}Eu_mMn_n)Al_{11}O_{16}N$, wherein M is metal, $0 \leq m \leq 0.2$, and $0 \leq n \leq 0.25$. Here, M includes alkaline earth metal.

According to an embodiment of the invention, an exciting light absorbed by the composition has a wavelength ranging from about 250 nm to about 400 nm.

According to an embodiment of the invention, an emitted light emitted from the composition has a wavelength ranging from about 420 nm to about 560 nm.

The invention further provides a white light illumination element that includes an LED chip, a first fluorescence material, and a second fluorescence material. The LED chip is configured on a substrate and emits an exciting light. The first fluorescence material is configured on the LED chip. A composition of the first fluorescence material includes an aluminum nitride oxide doped with at least one of Eu and Mn. The second fluorescence material is configured on the LED chip. A first emitted light emitted by the first fluorescence material after the first fluorescence material absorbs the exciting light emitted from the LED chip and a second emitted light emitted by the second fluorescence material after the second fluorescence material absorbs the exciting light emitted from the LED chip are mixed to generate a white light.

According to an embodiment of the invention, the aluminum nitride oxide includes $(M_{l-m-n}Eu_mMn_n)Al_{11}O_{16}N$, wherein M is metal, $0 \leq m \leq 0.2$, and $0 \leq n \leq 0.25$. Here, M includes alkaline earth metal.

According to an embodiment of the invention, the exciting light has a wavelength ranging from about 250 nm to about 400 nm.

According to an embodiment of the invention, the first emitted light has a wavelength ranging from about 420 nm to about 560 nm.

According to an embodiment of the invention, the second emitted light has a wavelength ranging from about 570 nm to about 680 nm.

According to an embodiment of the invention, the white light illumination element further includes a molding compound that is configured on the substrate and covers the LED chip. The first fluorescence material and the second fluorescence material are distributed into the molding compound.

Based on the above, the fluorescence material of the invention is not apt to be denatured due to changes of temperature and moisture. That is to say, the fluorescence material of the invention has favorable stability, which is conducive to improvement of the quality of the white light illumination element. On the other hand, the blue-green light can be provided by adjusting the wavelength of the light emitted by the fluorescence material of the invention based on different demands. Accordingly, the fluorescence material of the invention applied to the white light illumination element is conducive to improvement of the color rendering property of the white light illumination element.

In order to make the aforementioned and other features and advantages of the invention more comprehensible, embodiments accompanying figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

An embodiment of the invention provides a fluorescence material that has a composition. The composition includes an aluminum nitride oxide doped with at least one of europium (Eu) and manganese (Mn). Specifically, the aluminum nitride oxide includes $(M_{l-m-n}Eu_mMn_n)Al_{11}O_{16}N$, wherein M is metal, $0 \leq m \leq 0.2$, and $0 \leq n \leq 0.25$. According to an embodiment of the invention, M can be selected from alkaline earth metal.

Figure 1:
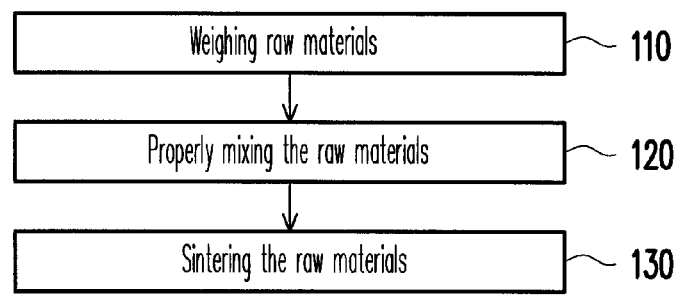
FIG. 1 is a schematic flow chart illustrating a process of preparing a fluorescence material according to an embodiment of the invention.

FIG. 1 is a schematic flow chart illustrating a process of preparing a fluorescence material according to an embodiment of the invention. With reference to FIG. 1, in step 110, raw materials are weighted. In this embodiment, the raw materials required for preparing the aforesaid fluorescence material includes but is not limited to alkaline-earth-metal carbonate, aluminum oxide, and aluminum nitride. The raw materials used in this embodiment selectively include at least one of europium bichloride and manganese oxide. That is to say, the fluorescence material of this embodiment can include europium bichloride only, manganese oxide only, or both europium bichloride and manganese oxide. The weighted amount of the raw materials can be determined based on the proportion of each element (e.g., m and n) in the chemical formula $(M_{l-m-n}Eu_mMn_n)Al_{11}O_{16}N$.

In step 120, the above-mentioned raw materials are properly mixed. A method of properly mixing the above-mentioned raw materials normally includes placing the raw materials into a container and grinding the raw materials. The grinding time can be 30 minutes, more than 30 minutes, or less than 30 minutes based on actual demands.

The properly mixed raw materials are sintered in step 130. In this embodiment, the raw materials can be sintered at the temperature from about 1400° C. to about 1600° C. However, in other embodiments of the invention, the sintering temperature can be adjusted based on the properties of the raw materials. On the other hand, the sintering time is about 6 hours to about 10 hours, for instance, and can be adjusted in consideration of the properties of the raw materials. Said parameters are merely exemplary and are not intended to limit the scope of the invention.

In the method of preparing the fluorescence material described in this embodiment, the sintering process is performed in the reducing environment, for instance. After said raw materials are sintered, the fluorescence material having the composition of $(M_{l-m-n}Eu_mMn_n)Al_{11}O_{16}N$ is obtained. Here, M is metal, $0 \leq m \leq 0.2$, and $0 \leq n \leq 0.25$. Since nitrogen element and oxygen element of the fluorescence material are bonded in a triple-bond manner, the fluorescence material of this embodiment has satisfactory stability. In particular, the fluorescence material of this embodiment does not contain elements sensitive to temperature and moisture, e.g., sulfur. Hence, the fluorescence material of this embodiment is rather stable and is not apt to be denatured due to changes of temperature and moisture.

Figure 2:
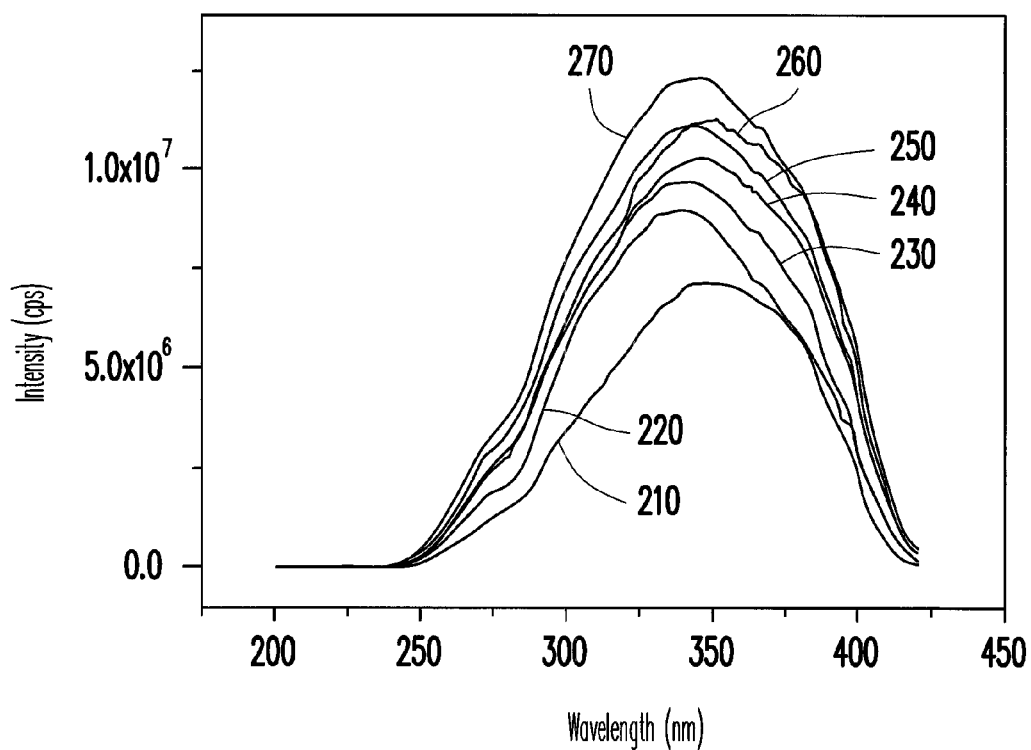
FIG. 2 illustrates the correlation between the wavelength and the intensity of an exciting light absorbed by a fluorescence material when the composition of the fluorescence material is $BaAl_{11}O_{16}N:Eu^{2+}$.

FIG. 2 illustrates the correlation between the wavelength and the intensity of an exciting light absorbed by a fluorescence material when the composition of the fluorescence material is $BaAl_{11}O_{16}N:Eu^{2+}$. With reference to FIG. 2, the curve 210 to the curve 270 indicate the correlation between the wavelength and the intensity of the exciting light absorbed by the fluorescence material having the composition of $BaAl_{11}O_{16}N:Eu^{2+}$ when different amounts of Eu are given. As shown in the curve 210 to the curve 270, when the fluorescence material has the composition of $BaAl_{11}O_{16}N:Eu^{2+}$, the exciting light that can be absorbed by the fluorescence material has the wavelength ranging from about 250 nm to about 400 nm, for instance. Namely, the fluorescence material of this embodiment can be excited by an ultraviolet light (having the wavelength of about 343 nm, for example) and correspondingly emit an exciting light.

Figure 3:
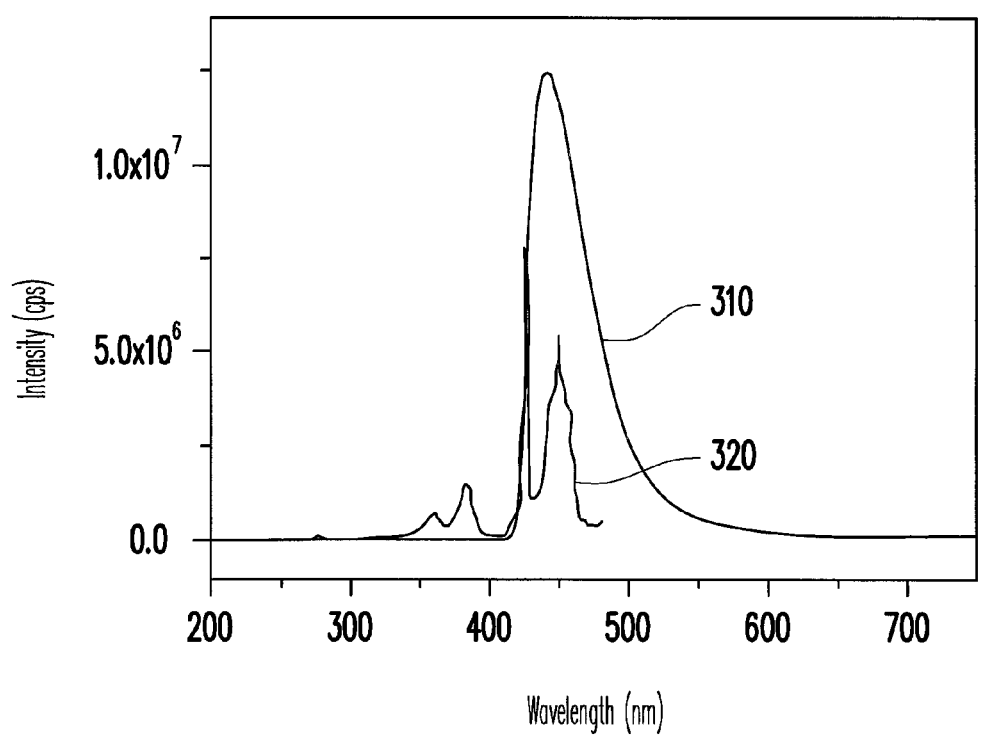
FIG. 3 illustrates the correlation between the wavelength and the intensity of an emitted light emitted by a fluorescence material when the composition of the fluorescence material is $BaAl_{11}O_{16}N:Eu^{2+}$, and the correlation between the wavelength and the intensity of an exciting light absorbed by another fluorescence material when the composition of the fluorescence material is $BaAl_{11}O_{16}N:Mn^{2+}$.

FIG. 3 illustrates the correlation between the wavelength and the intensity of light. With reference to FIG. 3, the curve 310 indicates the correlation between the wavelength and the intensity of the emitted light emitted by the fluorescence material when the composition of the fluorescence material is $BaAl_{11}O_{16}N:Eu^{2+}$, for instance. Here, when the composition of the fluorescence material is $BaAl_{11}O_{16}N:Eu^{2+}$, the emitted light of the fluorescence material has a wavelength ranging from about 420 nm to about 490 nm, for instance. As shown by the curve 310 of FIG. 3 and with reference to FIG. 2, when the composition of the fluorescence material is $BaAl_{11}O_{16}N:Eu^{2+}$, the fluorescence material can convert the exciting light having the wavelength ranging from about 250 nm to about 400 nm into the emitted light having the wavelength ranging from about 420 nm to about 490 nm.

Besides, the curve 320 illustrates the correlation between the wavelength and the intensity of the exciting light absorbed by the fluorescence material when the composition of the fluorescence material is $BaAl_{11}O_{16}N:Mn^{2+}$, for instance. Here, when the composition of the fluorescence material is $BaAl_{11}O_{16}N:Mn^{2+}$, the exciting light absorbed by the fluorescence material has a wavelength ranging from about 350 nm to about 460 nm, for instance. Given the fluorescence material has the composition of $BaAl_{11}O_{16}N:Eu^{2+}$, the curve 310 and the curve 320 show that the light emitted by said fluorescence material can be absorbed by the fluorescence material having the composition of $BaAl_{11}O_{16}N:Mn^{2+}$. Hence, if the fluorescence material is doped with both Eu and Mn, the fluorescence material is capable of transferring energy. That is to say, the light emitted by the fluorescence material can excite the fluorescence material itself, such that the fluorescence material can further emit the emitted light with higher intensity. Accordingly, the fluorescence material of this embodiment has high light emitting efficiency.

According to an embodiment, after the fluorescence material having the composition of $BaAl_{11}O_{16}N:Mn^{2+}$ is excited, the fluorescence material emits the light with the wavelength ranging from about 490 nm to about 560 nm, for instance. As a whole, the fluorescence material obtained by applying the aforesaid preparing method emits the emitted light that has the wavelength ranging from about 420 nm to about 560 nm, for instance.

Figure 4:
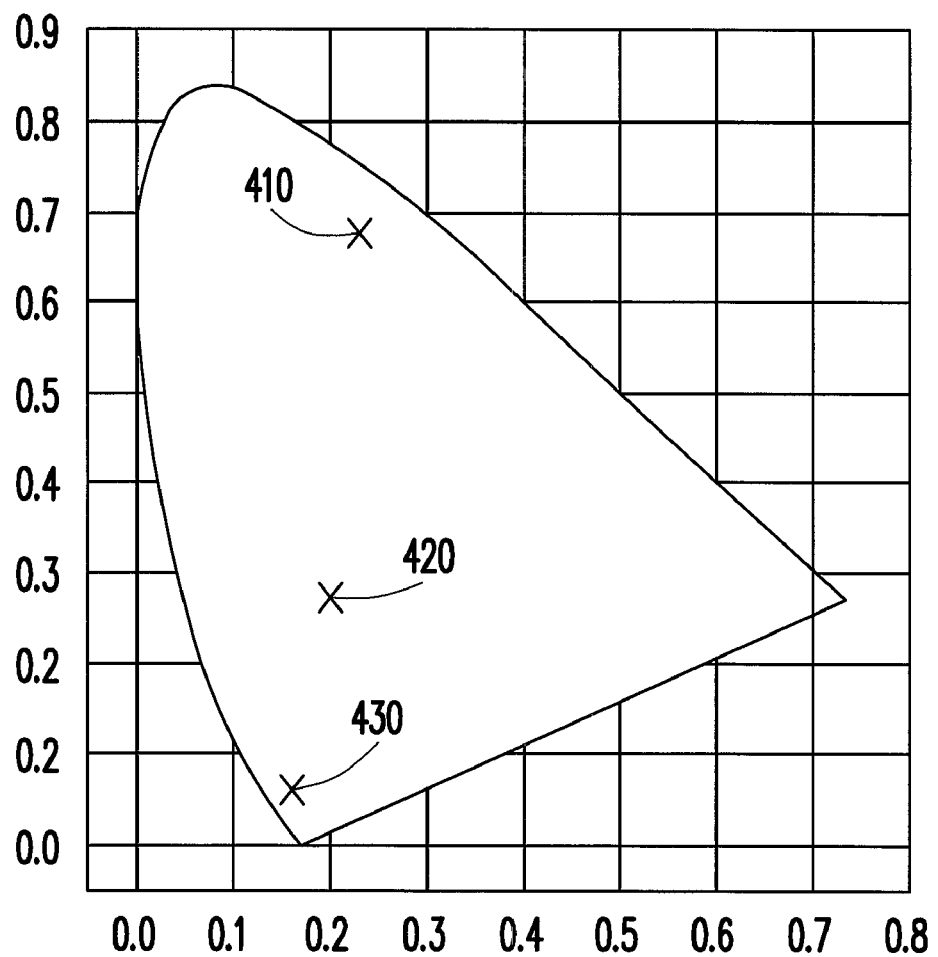
FIG. 4 illustrates where the emitted light of the fluorescence material is located in a chromaticity coordinate system according to an embodiment of the invention.

FIG. 4 illustrates where the light emitted by the fluorescence material is located in a chromaticity coordinate system according to an embodiment of the invention. With reference to FIG. 4, in the chromaticity coordinate system 400, the locations 410~430 respectively indicate the colors of the emitted lights of the fluorescence materials having different compositions. The location 410 indicates the color of the emitted light of a fluorescence material when the composition of the fluorescence material is $BaAl_{11}O_{16}N:Mn^{2+}$. The location 430 indicates the color of the emitted light of a fluorescence material when the composition of the fluorescence material is $BaAl_{11}O_{16}N:Eu^{2+}$. The location 420 indicates the color of the emitted light of a fluorescence material when the composition of the fluorescence material is $BaAl_{11}O_{16}N: Mn^{2+}, Eu^{2+}$. As indicated in FIG. 4, the location 410 actually falls within the range of blue light, and the location 430 actually falls within the range of green light. Given the fluorescence material is doped with both Eu and Mn, the color of the emitted light of the fluorescence material can fall within the range of blue-green light, i.e., at the location 420. Hence, the doped elements in the composition of the fluorescence material can be adjusted based on different demands in this embodiment, so as to generate the emitted light with different colors.

Figure 5:
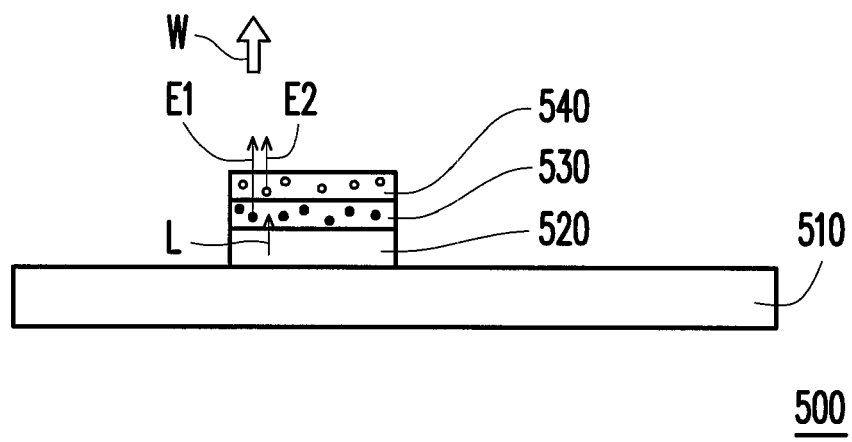
FIG. 5 is a schematic view illustrating a white light illumination element according to an embodiment of the invention.

FIG. 5 is a schematic view illustrating a white light illumination element according to an embodiment of the invention. With reference to FIG. 5, the white light illumination element 500 includes a substrate 510, an LED chip 520, a first fluorescence material 530, and a second fluorescence material 540. The LED chip 520 is configured on a substrate 510 and emits an exciting light L. The first fluorescence material 530 and the second fluorescence material 540 are both configured on the LED chip 510. A composition of the first fluorescence material 530 includes an aluminum nitride oxide doped with at least one of Eu and Mn. That is to say, the first fluorescence material 530 refers to the fluorescence material prepared by applying the method described in the previous embodiment. To sum up, the white light illumination element 500 contains dual fluorescence materials.

According to this embodiment, the aluminum nitride oxide of the first fluorescence material 530 includes $(M_{l-m-n}Eu_m Mn_n)Al_{11}O_{16}N$, wherein M is metal, $0 \leq m \leq 0.2$, and $0 \leq n \leq 0.25$. Besides, M can be substantially selected from alkaline earth metal. The wavelength of the exciting light L ranges from about 250 nm to about 400 nm, for instance. The first fluorescence material 530 absorbs the exciting light L emitted from the LED chip 510 and emits a first emitted light E1. As disclosed in the previous embodiment, the wavelength of the first emitted light E1 ranges from about 420 nm to about 560 nm, and the first emitted light E1 is a blue light, a blue-green light, or a green light, for example. The second fluorescence material 540 absorbs the exciting light L emitted from the LED chip 510 and emits a second emitted light E2. The wavelength of the second emitted light E2 ranges from about 570 nm to about 680 nm, for instance, and the second emitted light E2 is a red light. The first emitted light E1 and the second emitted light E2 can be mixed to generate a white light W.

As indicated in FIG. 4, the first emitted light E1 of the first fluorescence material 530 can be a blue light with slightly green or a green light. The first emitted light E1 and the second emitted light E2 (the red light) can be mixed to generate the white light W with high color saturation. Hence, the white light illumination element 500 has favorable color rendering property. Besides, nitrogen element and oxygen element of the first fluorescence material 530 are bonded in the triple-bond manner. Moreover, the composition of the first fluorescence material 530 does not contain sulfur and is thus not apt to be denatured due to changes of temperature and moisture. In view of the above, the stability of the first fluorescence material 530 is conducive to quality improvement and service life extension of the white light illumination element 500.

Figure 6:
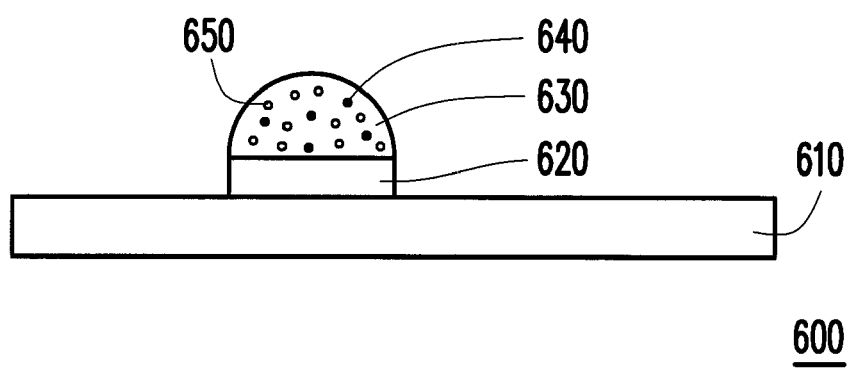
FIG. 6 is a schematic view illustrating a white light illumination element according to another embodiment of the invention.

FIG. 6 is a schematic view illustrating a white light illumination element according to another embodiment of the invention. With reference to FIG. 6, the white light illumination element 600 includes a substrate 610, an LED chip 620, a molding compound 630, a first fluorescence material 640, and a second fluorescence material 650. The LED chip 620 is configured on the substrate 610. The molding compound 630 is configured on the substrate 610 and covers the LED chip 620. The first fluorescence material 640 and the second fluorescence material 650 are both distributed into the molding compound 630. In this embodiment, the first fluorescence material 640 and the second fluorescence material 650 respectively refer to the first fluorescence material 530 and the second fluorescence material 540 described in the previous embodiment.

In other words, the composition of the first fluorescence material 640 includes an aluminum nitride oxide doped with at least one of Eu and Mn, and the second fluorescence material 650 is red fluorescence powder, for instance. As described in the previous embodiment, the first fluorescence material 640 has favorable stability, and the emitted light of the first fluorescence material 640 has a relatively wide wavelength. Therefore, the white light illumination element 600 is characterized by good quality and color rendering property.

In light of the foregoing, the fluorescence material of this invention includes the aluminum nitride oxide doped with at least one of Eu and Mn and is thus characterized by favorable stability. As a result, the fluorescence material of the invention applied to the white light illumination element is conducive to improvement of the quality of the white light illumination element. On the other hand, the fluorescence material of the invention can emit the blue-green light, and the white light with high color saturation can be generated when the blue-green light is applied together with a red fluorescence material. Consequently, the white light illumination element using the fluorescence material of the invention can have favorable color rendering property.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A fluorescence material having a composition, the composition comprising an aluminum nitride oxide doped with europium and manganese, wherein the aluminum nitride oxide comprising $(M_{l-m-n}Eu_mMn_n)Al_{11}O_{16}N$, wherein M is metal, $0 \leq m \leq 0.2$, and $0 \leq n \leq 0.25$.

2. The fluorescence material as claimed in claim 1, wherein M comprises alkaline earth metal.

3. The fluorescence material as claimed in claim 1, wherein an exciting light absorbed by the composition has a wavelength ranging from about 250 nm to about 400 nm.

4. The fluorescence material as claimed in claim 1, wherein an emitted light emitted from the composition has a wavelength ranging from about 420 nm to about 560 nm.

5. A white light illumination element comprising:
   a light emitting diode chip configured on a substrate and emitting an exciting light;
   a first fluorescence material configured on the light emitting diode chip, a composition of the first fluorescence material comprising an aluminum nitride oxide doped with europium and manganese, wherein the aluminum nitride oxide comprising $(M_{1-m-n}Eu_mMn_n)Al_{11}O_{16}N$, wherein M is metal, $0 \leq m \leq 0.2$, and $0 \leq n \leq 0.25$; and
   a second fluorescence material configured on the light emitting diode chip, wherein the first fluorescence material absorbs the exciting light emitted from the light emitting diode chip and emits a first emitted light, the second fluorescence material absorbs the exciting light emitted from the light emitting diode chip and emits a second emitted light, and the first emitted light and the second emitted light are mixed to generate a white light.

6. The white light illumination element as claimed in claim 5, wherein M comprises alkaline earth metal.

7. The white light illumination element as claimed in claim 5, wherein the exciting light has a wavelength ranging from about 250 nm to about 400 nm.

8. The white light illumination element as claimed in claim 5, wherein the first emitted light has a wavelength ranging from about 420 nm to about 560 nm.

9. The white light illumination element as claimed in claim 5, wherein the second emitted light has a wavelength ranging from about 570 nm to about 680 nm.

10. The white light illumination element as claimed in claim 5, further comprising a molding compound configured on the substrate and covering the light emitting diode chip, wherein the first fluorescence material and the second fluorescence material are distributed into the molding compound.

* * * * *